④ United States Patent [19]
Tanaka
[11] 3,829,604
[45] Aug. 13, 1974

[54] ENCASED MICRO-CIRCUIT AND THE PROCESS FOR MANUFACTURING THE SAME

[75] Inventor: Kunihiro Tanaka, Tokyo, Japan
[73] Assignee: Nippon Electric Company Limited, Tokyo, Japan

[22] Filed: Apr. 10, 1973
[21] Appl. No.: 349,859

[30] Foreign Application Priority Data
Apr. 13, 1972 Japan .............................. 47-44231

[52] U.S. Cl. .................. 174/52 S, 29/626, 29/627, 317/101 DH
[51] Int. Cl. .......................................... H05k 5/00
[58] Field of Search ............ 174/52 R, 52 PE, 52 S; 317/101 CC, 101 DH; 29/626, 627

[56] References Cited
UNITED STATES PATENTS
3,429,980 2/1969 Guttmann ......................... 174/52 S
3,501,582 3/1970 Heidler et al. ................. 174/52 PE

*Primary Examiner*—David Smith, Jr.
*Attorney, Agent, or Firm*—Sandoe, Hopgood & Calimafde

[57] ABSTRACT

One or more leads are bonded to electrodes on a circuit board. Each lead has a first upstanding portion that extends away from a principal surface of the board and a second portion that extends parallel to that principal surface. The second portions are inserted through apertures in a block which is then inserted in an open ended case having a stair formed in its interior with the first portion of each lead clamped between the stair and a surface of the block.

3 Claims, 10 Drawing Figures

ENCASED MICRO-CIRCUIT AND THE PROCESS FOR MANUFACTURING THE SAME

BACKGROUND OF THE INVENTION

This invention relates to an encased structure of a micro-circuit including a hybrid integrated circuit, a thin film integrated circuit, a thick film integrated circuit, a micro-assembly, or the like.

The conventional encased structure of a micro-circuit such as a hybrid integrated circuit has been formed by soldering leads to electrodes of its circuit board, setting the circuit board in a case and filling a resin into the case. Otherwise, the structure has been made by forming a lead block in which a plurality of leads are molded with a resin, soldering the leads of the lead block to the electrodes of the circuit board, and then setting the circuit board in a case.

These conventional encased structures of hybrid integrated circuits, however, have some disadvantages. In the former structure, the constituents of the resin are liable to damage electric elements mounted on the circuit board, while in the latter, the resin of the lead block tends to change its shape due to the heat applied during the soldering of the leads to the circuit board. These disadvantages are all caused by the use of resin-potting or resin-molding.

It is, therefore, an object of the present invention to provide a reliable encased structure for a micro-circuit without relying on resin-potting or resin-molding.

It is another object of this invention to simplify the manufacture of an encased micro-circuit.

SUMMARY OF THE INVENTION

The encased micro-circuit of this invention comprises a circuit board for mounting at least one electric element and having electrodes thereon, leads bonded to the electrodes, each lead having a first portion extending at a right angle away from the surface of the circuit board and a second portion extending from circuit board parallel to its principal surface, a block having apertures in which the second portions of the leads are inserted, the upstanding first portions of the leads being in contact with the upper surface of the block, and a case in which the circuit board is inserted, the inner wall of the case having a stair portion in contact with the upstanding portions of the leads.

According to another aspect of this invention, the manufacturing process of the encased micro-circuit comprises the steps of bonding the leads to the electrodes of the circuit board so as to extend a portion of each lead at a right angle to the surface of the circuit board and to extend one end in parallel to the surface of the circuit board, inserting the leads in the apertures of the block, and setting the circuit board in the case.

According to the invention, the disadvantageous influences caused by the resin do not result, since it is not necessary to fill the resin in the case. The transformation of the figure of the block can be avoided, because the leads are bonded to the circuit board before the leads are set through the apertures of the block. Further, the manufacturing process of this invention avoids the steps of filling the resin in the case and forming the resin-molded lead block, and is therefore comparatively simple.

BRIEF DESCRIPTION OF THE DRAWINGS

The object, features and advantages of the present invention will be better understood from the following detailed description of an embodiment of the invention taken in conjunction with the accompanying drawings wherein:

FIG. 3A is a front view of lead block employed in the embodiment of the invention, while

FIG. 5A is a perspective view of a case employed in the embodiment, while FIG. 6A is a perspective view of an encased micro-circuit according to the embodiment of the invention, while

DESCRIPTION OF THE PREFERRED EMBODIMENTS

Figure 1A:
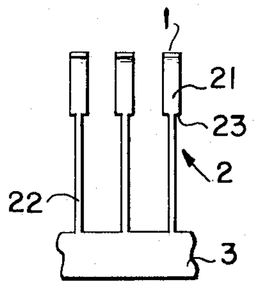
FIGS. 1A and 1B are a plan view and a side view of leads employed in an embodiment of the invention before being bonded to a circuit board, respectively.
Figure 1B:
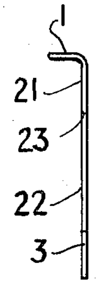

Referring first to FIGS. 1A and B, a lead pattern composed of a plurality of leads 2 and a lead frame 3 holding and joining the leads 2 is formed by punching from a metallic foil. Each lead 2 is composed of a relatively wide connector section 21 and a narrow strip section 22. A first portion 1 of the connector section 21 is bent at a right angle to the strip 22, which forms a second portion.

Figure 2:
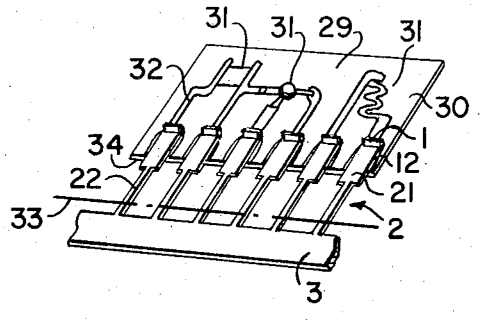
FIG. 2 is a perspective view of the circuit board and leads bonded thereto.

Referring to FIG. 2, the connector sections 21 of the leads 2 are bonded by a thermo-compression method, to respective electrodes 12 aligned at the bottom edge 34 of a circuit board 30 on which electric elements 31 and the metal wirings 32 are mounted. The first position 1 is upstanding and projects away from the principal surface 29 of the circuit board 30, while the second position 22 of the lead 2 extends beyond the bottom edge of the board 30 parallel to its principal surface. The frame member 3 is then removed from the leads 2 by cutting along the line 33.

Figure 3A:
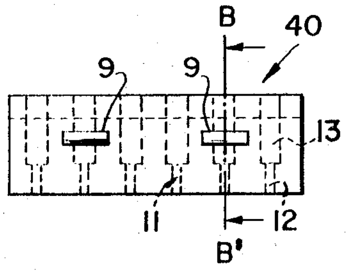
Figure 3B:
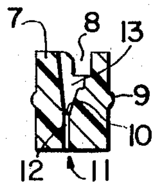
FIG. 3B is a cross sectional view of the block taken along the line B—B′ of FIG. 3A.
Figure 4:
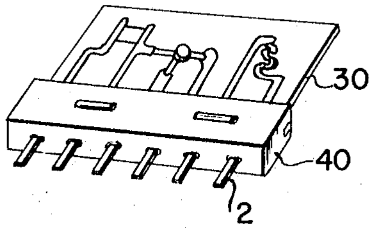
FIG. 4 is a perspective view of the block and the circuit board inserted therein.

Referring now to FIGS. 3A and B a lead block 40 made of an insulating material such as a epoxy resin has a plurality of apertures 11 suited for fitting the leads 2 therein, projections 9 formed on the outer wall of the block 40 and a groove 8 in which the bottom edge 34 of the circuit board 30 is to be accommodated. Each aperture 11 has a stair portion 10 which fits the bottom end 23 of the connector section 21 of the lead 2. The stair portion 10 divides the aperture 11 into a narrow portion 12 adapted for the strip section 22 of the lead 2 and a wide portion 13 adapted for the connector section 21. With the lead 2 inserted, the base of the connector section 21 ends at the surface of the stair portion 10. The bent first portion 1 of the connector section 21 of each lead 2 rests on upper surface 7 of the block 40. The manner of mechanical connection of the leads 2 with the lead block 40 may be seen in FIG. 6B. FIG. 4 shows the thus-formed subassembly which is composed of the leads 2, circuit board 30 and the lead block 40.

Figure 5A:
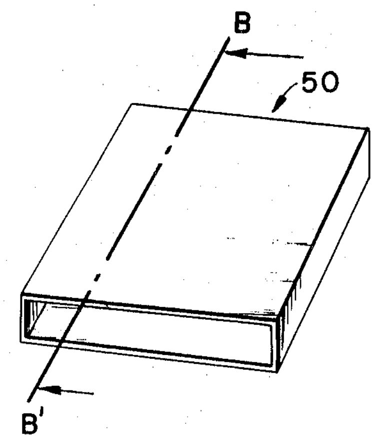
Figure 5B:
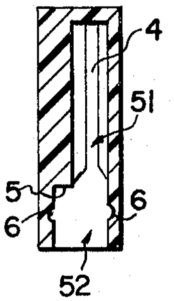
FIG. 5B is a cross-sectional view of the case taken along the line B—B′ of FIG. 5A.

Referring now to FIGS. 5A and 5B, the interior of the hollow case 50 made of an insulating material, such as a nylon containing a glass, has two parts 51 and 52. One part 51 is for setting the circuit board 30, while the other part 52 is for the block 40. A stair portion 5 is formed at the upper end of the aforementioned other part 52, while in the inside walls of this part 52, four grooves 6 are provided to receive the projections 9 of the block 40. In each side wall of the above-mentioned part 51 of the interior of the case 50, a groove 4 is formed to receive the side edge of the circuit board 30.

Figure 6A:
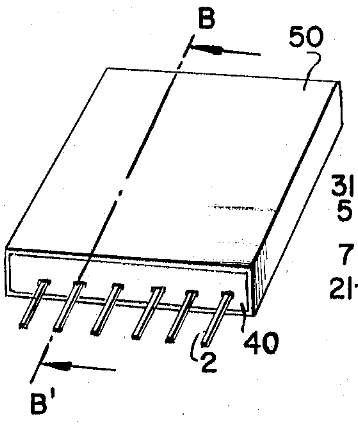
Figure 6B:
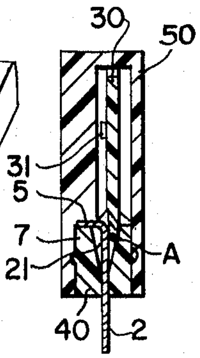
FIG. 6B is a cross sectional view thereof taken along the line B—B′ of FIG. 6A.

Referring now to FIGS. 6A and B, there is shown an encased micro-circuit made by inserting the subassembly of FIG. 4 into the open end of the case 50. According to the above-mentioned embodiment of this invention, since the bent first portions 1 of the leads 2 are securely clamped in position by the upper surface 7 of the block 40 and the stair portion 5 of the case 50, no substantial force can be exerted on the junctions A between the bonding sections 21 of the leads 2 and the electrodes 12 of the circuit board 30 if an excessive compression or tensile force is applied externally to the leads 2 which project through the apertures 11.

This invention has been explained in connection with the embodiment of a hybrid integrated circuit. It is, however, obvious to one skilled in the art that this invention is also applicable to other micro-circuits, namely the thin film integrated circuit, the thick film integrated circuit, the micro assembly or the like.

The scope of the invention is not limited to the above preferred embodiment.

What is claimed is:

1. An encased micro-circuit comprising:

a circuit board for mounting at least one electric element, said board having a plurality of electrodes thereon;

a plurality of leads bonded to said electrodes, each lead having an upstanding first portion that extends away from a principal surface of said board and a second portion that extends parallel to said principal surface;

a block defining apertures in which said leads are inserted; and a case in which said circuit board and said block are inserted, an inner wall of said case defining a stair, the first portions of each lead being held between said stair and the surface of said block.

2. The micro-circuit of claim 1, wherein the second portion of each lead extends through a corresponding aperture in said block to the exterior of said case.

3. A method for making an encased micro-circuit comprising the steps of:

mounting at least one electric element on a circuit board having an electrode thereon;

forming a lead having a first upstanding portion, a second portion extending at an angle to said first portion and a bonding portion;

attaching said bonding portion to said electrode so that said first portion extends away from a principal surface of said circuit board and so that said second portion extends parallel to said principal surface;

inserting said second portion through an aperture in a block; and inserting said block in a casing having a stair formed therein so that said upstanding first portion of said lead is held between said stair and a surface of said block.

* * * * *